July 1, 1952 W. H. WIRKLER 2,602,159
FREQUENCY MODULATION GENERATOR
Filed June 14, 1946
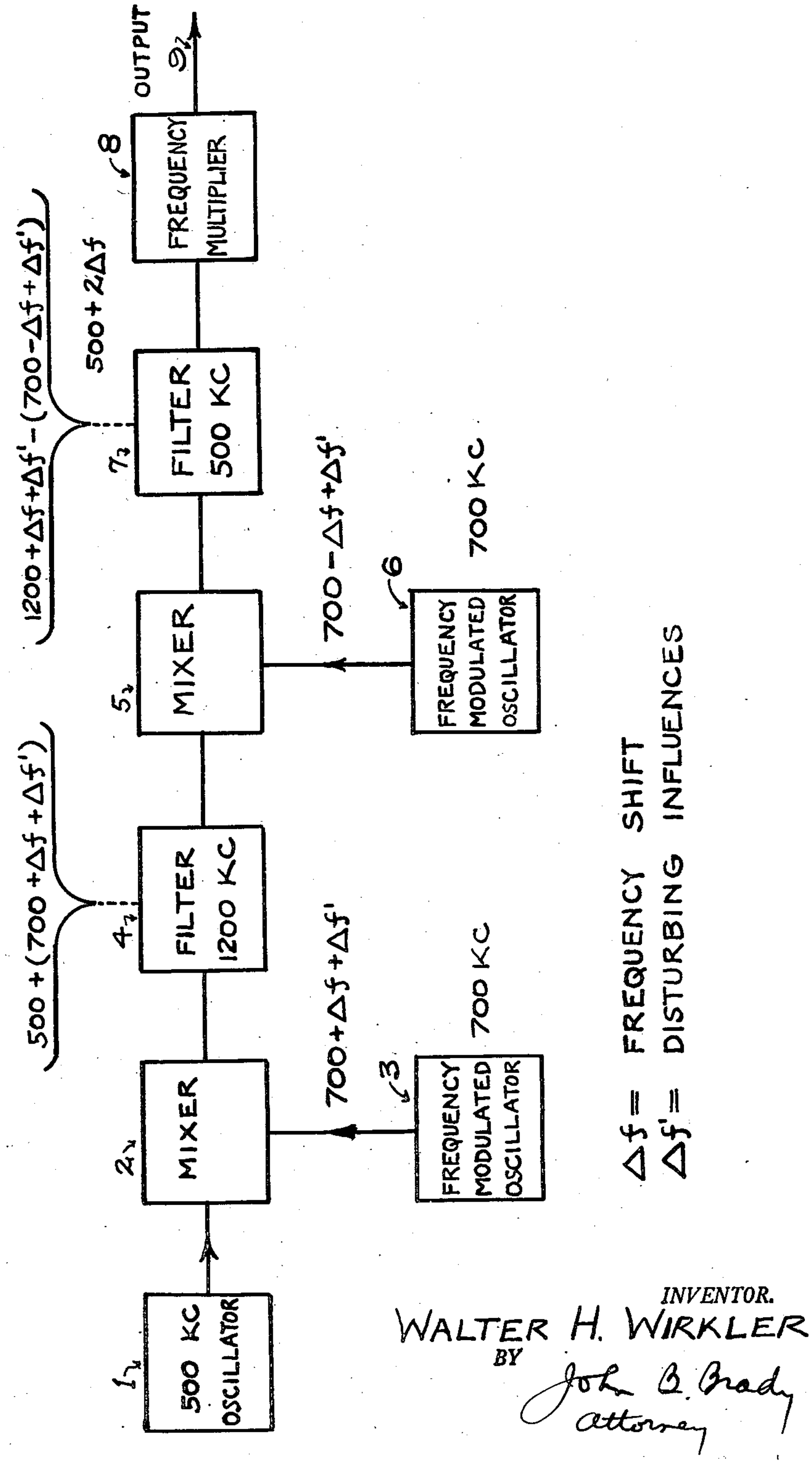
INVENTOR.
WALTER H. WIRKLER
BY John B. Brady
Attorney Patented July 1, 1952 2,602,159

UNITED STATES PATENT OFFICE 2,602,159

FREQUENCY MODULATION GENERATOR

Walter H. Wirkler, Cedar Rapids, Iowa, assignor to Collins Radio Company, Cedar Rapids, Iowa, a corporation of Iowa Application June 14, 1946, Serial No. 676,644

8 Claims. (Cl. 332—22)

My invention relates broadly to frequency modulation systems and more particularly to an improved wide band frequency modulation system.

One of the objects of my invention is to provide a frequency modulation system having wide band frequency modulation with stabilized operation.

Another object of my invention is to provide a frequency modulation generator circuit including means for compensating the effects of disturbing influences which tend to shift the frequency of the frequency modulation system undesirably.

Still another object of my invention is to provide an improved method of operation of a frequency modulation generator, whereby, a pair of frequency modulated oscillators are operated into a frequency modulation system in opposite frequency modulating relation so that as one oscillator increases its frequency with an applied voltage the second oscillator decreases its frequency with the same applied voltage and the combined outputs thereof impressed upon a frequency modulation transmission circuit.

Still another object of my invention is to provide an improved frequency modulation system employing a pair of frequency modulated oscillators varying in frequency in opposite senses with means for so combining the outputs thereof that double band width frequency shift may be effected in transmission while canceling disturbing influences which tend to shift the frequency of the frequency modulation system undesirably.

Still another object of my invention is to provide a novel association of frequency modulated oscillators, mixer circuits and filter systems for effecting wide band frequency modulation as set forth more fully in the specification hereinafter following by reference to the accompanying drawing which schematically shows the arrangement of the frequency modulation generator of my invention in a transmission channel. This frequency modulation generator possesses substantial advantages over the reactance tube modulator as well as over the phase shift method of generating frequency modulation. The reactance tube system has the disadvantage of possessing a low frequency stability, while the phase shift method has the disadvantage of requiring a large number of multiplier stages in order to arrive at the necessary frequency shift at the output frequency. This system has neither of the two foregoing disadvantages, and in addition is a simple and practical circuit.

Referring to the drawing, a 500 kc. crystal controlled oscillator 1 having high stability is fed to a mixer system 2. Also fed to this same mixer 2 is a frequency modulated oscillator 3 operating at 700 kc. This FM oscillator 3 may be of any standard form. The output here is represented at the mean frequency 700 plus $\Delta f$ referring to the frequency shift and plus $\Delta f'$ which refers to any disturbing influences which tend to shift the frequency of the oscillator 3 undesirably. The sum of the outputs of the 700 kc. oscillator 3 and the 500 kc. oscillator 1 is selected in a filter 4 which is tuned sharply to 1200 kc. The output frequency is indicated as enclosed by the brackets above the block representing the 1200 kc. filter 4. This wave is fed to a second mixer 5 where it is mixed with the output of an identical 700 kc. FM oscillator 6. This FM oscillator 6, however, varies its frequency in an opposite sense as compared with the first FM oscillator 3, that is if the first oscillator 3 increases its frequency with an applied voltage, the second oscillator 6 decreases its frequency with this same applied voltage. That is to say while oscillator 3 varies in a positive sense, oscillator 6 varies in a negative sense and vice versa. The output of the mixer 5 is fed to a second filter 7 tuned sharply to 500 kc. which selects the difference between the 700 kc. FM oscillator 6 and the 1200 kc. frequency modulated wave from the first mixer 2. This difference frequency is as indicated in the brackets above the block representing this 500 kc. filter 7.

As may be seen, the $\Delta f'$ terms are cancelled out in the second mixer 5, resulting in an output which is 500 kc. plus $2\Delta f$, or in other words, twice the frequency deviation is possible using the system of my invention, as compared to the frequency deviation of either FM oscillator 3 or 6 used alone. The output of the second filter 7 is fed through a suitable multiplying system 8 to arrive at the desired output frequency supplied to the transmission channel represented at 9. The elimination of the $\Delta f'$ terms indicates that voltage and temperature instabilities in the output frequency will be cancelled out, as will any other disturbing influences which affect each FM oscillator 3 and 6 equally.

Since the filter operates at a relatively low frequency at which the frequency swing is very small, a narrow band filter operates satisfactorily at 4. The system of multipliers 8 is employed after the frequency modulation is generated by the two oscillators 3 and 4 and mixer systems 2 and 5. The oscillators 3 and 6 have a substantially identical mean frequency. Frequency correction is achieved by means of the addition and subtraction in the two mixer circuits 2 and 5.

While I have described my invention in its preferred embodiment, I realize that modifications may be made in the arrangement of the circuit components, and I desire that it be understood that no limitations upon my invention are intended other than may be imposed by the scope of the appended claims.

What I claim as new and desire to secure by Letters Patent of the United States is as follows:

1. A frequency modulation generator comprising in combination an oscillator of predetermined frequency, a mixer circuit connected with said oscillator, a first frequency modulated oscillator having a mean frequency subject to a frequency shift of $\Delta f$ and further subject to disturbing influences of $\Delta f'$ also connected with said mixer circuit, a filter tuned over a narrow band for the selection of a frequency within the frequency range of the sum of the frequencies of said oscillator and said frequency modulated oscillator, a further mixer circuit connected with the output of said filter, a second frequency modulated oscillator connected with said last mentioned mixer circuit and having a frequency substantially identical to the frequency of said first mentioned frequency modulated oscillator but proportionally varying in frequency in the opposite sense to that of said first mentioned frequency modulated oscillator, a filter circuit connected with the output of said last mentioned mixer circuit and tuned to a frequency for selecting the difference between the frequency of the frequency modulated oscillators and the frequency selected by said first mentioned filter, and a connection between said last mentioned filter and a frequency multiplication system.

2. In a frequency modulation generator employing a fixed frequency oscillator and a pair of independent frequency modulated oscillators of substantially identical mean frequencies mutually coupled through mixer and filter circuits, the method of effecting frequency modulation which comprises generating frequency modulated energy, generating constant frequency oscillations, combining the frequency modulated energy with the constant frequency oscillations, selectively and sharply filtering the combined outputs of the frequency modulated energy and the constant frequency oscillations at a frequency within the frequency range of the sum of the frequencies, generating frequency modulated oscillations proportionally varying in the opposite sense to the frequency of the aforesaid frequency modulated energy mixing the last mentioned frequency modulated oscillations with the aforesaid filtered energy and selecting the combined frequencies from the last mentioned mixing process.

3. A frequency modulation generator comprising a pair of coacting frequency modulated oscillators of a substantially identical mean frequency each arranged to proportionally vary in frequency in opposite senses about the same mean frequency, an oscillator of fixed frequency characteristic, a first mixer circuit for combining the output of one of said frequency modulated oscillators with the output of said fixed frequency oscillator, a sharply tuned filter for selecting a frequency within the range of the sum of the said combined output frequencies, a second mixer circuit, a connection between said filter and said second mixer circuit, a connection between said second mixer circuit and the other of said frequency modulated oscillators, a second filter for selecting the difference frequency between the frequency impressed upon said second mixer circuit and the other of said frequency modulated oscillators, said mixer circuits effecting frequency correction by means of addition and subtraction, and means for multiplying the resultant frequency.

4. A frequency modulation generator comprising a pair of coacting frequency modulated oscillators of substantially identical mean frequency, one of said oscillators operating to increase in frequency while the other of said oscillators operates to proportionally decrease in frequency with respect to the same mean frequency, a constant frequency control oscillator associated with each of said frequency modulated oscillators, a pair of mixer circuits for combining the outputs of said constant frequency control oscillator and each of said frequency modulated oscillators, a sharply tuned filter interposed between said mixer circuits and a separate filter connected with the output of the last of said mixer circuits.

5. A frequency modulation generator comprising a pair of coacting frequency modulated oscillators of substantially identical mean frequency, one of said oscillators varying in a positive direction while the other of said oscillators is varying proportionally in a negative direction about the same mean frequency, a constant frequency control oscillator associated with each of said frequency modulated oscillators, means for combining the outputs of said frequency modulated oscillators and said constant frequency control oscillator, and means for cancelling disturbing influences incident upon said oscillators while integrating by addition and subtraction the frequency shift of each of said frequency modulated oscillators.

6. In a frequency modulation system including a constant frequency oscillator and a pair of frequency modulated oscillators subject to disturbing influences thereon, the method of combining the outputs of the frequency modulated oscillators with the constant frequency oscillator which comprises simultaneously varying the frequency modulated oscillators equally in opposite senses about a mean frequency, mutually cancelling the effects of disturbing influences upon each of said oscillators, integrating the frequency shift of each of said frequency modulated oscillators and multiplying the resultant frequency of the integrated frequency shift of each of said frequency modulated oscillators.

7. A frequency modulation generator comprising in combination an oscillator of predetermined frequency, a mixer circuit connected with said oscillator, a frequency modulated oscillator having a mean frequency subject to a frequency shift of $\Delta f$ and further subject to distributing influences of $\Delta f'$ also connected with said mixer circuit, a narrow band filter sharply tuned for the selection of a frequency within the frequency range of the sum of the frequencies of said oscillator and said frequency modulated oscillator, a further mixer circuit connected with the output of said filter, a second frequency modulated oscillator connected with said last mentioned mixer circuit and having the same mean frequency as the aforesaid frequency modulated oscillator but subject to a frequency shift of $\Delta f$ proportionally in an opposite direction to the frequency shift of said first mentioned frequency modulated oscillator and subject to the same disturbing influences $\Delta f'$, a filter tuned to the difference frequency between the frequency delivered by said first mentioned mixer circuit and said second mentioned frequency modulated oscillator, means for effecting cancellation of said disturbing influences $\Delta f'$ and simultaneously delivering frequency modulated energy at a frequency shift substantially equal to $2\Delta f$ at the output of said last mentioned filter, and means for multiplying the resultant frequency at the output of said last mentioned filter.

8. The method of signalling which comprises, generating a master frequency F, generating a pair of local auxiliary frequencies each of frequency $f$, frequency-modulating both said local frequencies by the same signal but in opposite respects to produce respective side bands $(f \pm \Delta f)$ and $(f \mp \Delta f)$, mixing the $(f \pm \Delta f)$ frequency from one local oscillator with said master frequency F, and selecting one side band alone, mixing the said selected side band with the frequency $(f \mp \Delta f)$ from the other local oscillator, and selecting therefrom a side band component $(F \pm 2\Delta f)$.

WALTER H. WIRKLER.

REFERENCES CITED

The following references are of record in the file of this patent:

UNITED STATES PATENTS

| Number | Name | Date |
|---|---|---|
| 2,290,159 | Armstrong | July 21, 1942 |
| 2,322,588 | Peterson | June 22, 1943 |
| 2,335,934 | Goldstine | Dec. 7, 1943 |
| 2,436,834 | Stodola | Mar. 2, 1948 |
| 2,451,430 | Barone | Oct. 12, 1948 |